United States Patent
Kaneko et al.

(10) Patent No.: US 12,398,038 B2
(45) Date of Patent: Aug. 26, 2025

(54) MANUFACTURING METHOD OF MODIFIED ALUMINUM NITRIDE RAW MATERIAL, MODIFIED ALUMINUM NITRIDE RAW MATERIAL, MANUFACTURING METHOD OF ALUMINUM NITRIDE CRYSTALS, AND DOWNFALL DEFECT PREVENTION METHOD

(71) Applicants: KWANSEI GAKUIN EDUCATIONAL FOUNDATION, Hyogo (JP); TOYO ALUMINIUM KABUSHIKI KAISHA, Osaka (JP); TOYOTA TSUSHO CORPORATION, Aichi (JP)

(72) Inventors: Tadaaki Kaneko, Sanda (JP); Daichi Dojima, Sanda (JP); Moeko Matsubara, Osaka (JP); Yoshitaka Nishio, Osaka (JP)

(73) Assignees: KWANSEI GAKUIN EDUCATIONAL FOUNDATION, Hyogo (JP); TOYO ALUMINIUM KABUSHIKI KAISHA, Osaka (JP); TOYOTA TSUSHO CORPORATION, Aichi (JP)

( * ) Notice: Subject to any disclaimer, the term of this patent is extended or adjusted under 35 U.S.C. 154(b) by 229 days.

(21) Appl. No.: 17/919,106

(22) PCT Filed: Mar. 30, 2021

(86) PCT No.: PCT/JP2021/013749
§ 371 (c)(1),
(2) Date: Oct. 14, 2022

(87) PCT Pub. No.: WO2021/210396
PCT Pub. Date: Oct. 21, 2021

(65) Prior Publication Data
US 2023/0166972 A1 Jun. 1, 2023

(30) Foreign Application Priority Data
Apr. 14, 2020 (JP) .................................. 2020-072553

(51) Int. Cl.
C30B 23/02 (2006.01)
C01B 21/072 (2006.01)
(Continued)

(52) U.S. Cl.
CPC ........ *C01B 21/0728* (2013.01); *C30B 23/066* (2013.01); *C30B 29/403* (2013.01);
(Continued)

(58) Field of Classification Search
CPC . C01B 11/0728; C30B 23/066; C30B 29/403; C30B 35/007; C01P 2004/03; C01P 2004/04
See application file for complete search history.

(56) References Cited

U.S. PATENT DOCUMENTS 6,800,576 B2  10/2004  Katsuda et al.
6,919,286 B2  7/2005  Yoshikawa et al.
(Continued)

FOREIGN PATENT DOCUMENTS

JP  S6347382 A  2/1988
JP  2011-026160 A  2/2011
(Continued)

OTHER PUBLICATIONS

Du et al, "Structure and properties of AlN ceramics prepared with spark plasma sintering of ultra-fine powders" MAterials Science and Engineering, A vol. 496, 2008, 269-272.*
(Continued)

*Primary Examiner* — Robert M Kunemund
(74) *Attorney, Agent, or Firm* — Calfee, Halter & Griswold LLP

(57) ABSTRACT

The purpose of the present is to provide a modified AlN source for suppressing downfall defects. This manufacturing
(Continued)

method of a modified aluminum nitride source involves a heat treatment step for heat treating an aluminum nitride source and generating an aluminum nitride sintered body.

4 Claims, 3 Drawing Sheets

(51) Int. Cl.
  *C30B 23/06* (2006.01)
  *C30B 29/40* (2006.01)
  *C30B 35/00* (2006.01)
(52) U.S. Cl.
  CPC ........ *C30B 35/007* (2013.01); *C01P 2004/03* (2013.01); *C01P 2004/04* (2013.01); *C01P 2006/11* (2013.01); *C01P 2006/80* (2013.01)

(56) References Cited

U.S. PATENT DOCUMENTS

| 8,148,283 B2 | 4/2012 | Kanechika et al. |
| 2006/0217259 A1* | 9/2006 | Teratani ................ C04B 35/645 501/98.5 |
| 2018/0308680 A1 | 10/2018 | Reddy et al. |
| 2019/0276369 A1 | 9/2019 | Kobayashi et al. |

FOREIGN PATENT DOCUMENTS

| JP | 63047382 | * | 3/2011 |
| JP | 2018-131367 A | | 8/2018 |
| JP | 2019-151520 A | | 9/2019 |
| TW | 201903833 A | | 1/2019 |
| WO | 2018/117161 A1 | | 6/2018 |
| WO | 2019246027 A1 | | 12/2019 |

OTHER PUBLICATIONS

Google translation 2024 2 pages.*
Balkas et al., "Growth of Bulk AlN and GaN Single Crystals by Sublimation", MRS Proceedings (1996), vol. 449, pp. 41-46.
Gu et al., "Sublimation growth of aluminum nitride crystals", Journal of Crystal Growth (2006), vol. 297, No. 1, pp. 105-110.
Qiao et al., "Microstructure and thermal conductivity of spark plasma sintering AlN ceramics", Materials Science and Engineering: B (2003), vol. 99, No. 1-3, pp. 102-105.
Smathi et al., "Influence of interface formation on the structural quality of AlN single crystals grown by sublimation method", Physica Status Solidi. C: Current Topics in Solid State Physics (2011), vol. 8, No. 7-8, pp. 2107-2109.
EPO Communication and European Search Report issued in corresponding EP application No. 21787787.7 on Apr. 23, 2024 (13 pages).
English translation of International Search Report from PCT/JP2021/013749 dated Jun. 1, 2021 (2 pages).

* cited by examiner

MANUFACTURING METHOD OF MODIFIED ALUMINUM NITRIDE RAW MATERIAL, MODIFIED ALUMINUM NITRIDE RAW MATERIAL, MANUFACTURING METHOD OF ALUMINUM NITRIDE CRYSTALS, AND DOWNFALL DEFECT PREVENTION METHOD

CROSS-REFERENCE TO RELATED APPLICATIONS

This application is a 371 of PCT Application No. PCT/JP2021/013749, filed on Mar. 30, 2021, which claims priority to Japanese Application No. 2020-072553, filed on Apr. 14, 2020, the contents of which are hereby incorporated by reference as if recited in their entirety.

TECHNICAL FIELD

The present invention relates to a method for manufacturing a modified aluminum nitride source, a modified aluminum nitride source, a method for manufacturing an aluminum nitride crystal, and a method for suppressing downfall.

BACKGROUND ART

Aluminum nitride (AlN) has a high thermal conductivity and an excellent electrical insulation, and is widely used in various applications including semiconductor substrates and semiconductor package base materials.

In recent years, a wide band gap (6.28 eV) of AlN has attracted attention, and application to a light emitting diode (LED) that outputs deep ultraviolet (UV-C) is expected.

However, since the substrate of AlN alone has a small diameter and is expensive, a different substrate in which an AlN film is formed on a substrate made of another material is often used as a large-diameter and inexpensive substrate.

For example, Patent Literature 1 describes a substrate including a sapphire substrate, a first AlN film formed on a first main surface of the sapphire substrate, and an AlN film formed on a second main surface opposite to the first main surface of the sapphire substrate.

CITATION LIST

Patent Literature

Patent Literature 1: JP 2019-151520 A

SUMMARY OF INVENTION

Technical Problem

Since AlN is a refractory material, it is difficult to grow a single crystal by a melt method in which a large-diameter and high quality single crystal like silicon can be easily obtained. Therefore, it is necessary to perform a single crystal growth mainly by a vapor phase method.

However, an aluminum nitride single crystal wafer diameter with sufficiently high quality as a semiconductor substrate is currently limited to 2 inches.

One of the reasons why an AlN single crystal having high quality and large diameter cannot be manufactured is anisotropy in AlN crystal growth.

The AlN has a problem that growth in a c-direction (a direction perpendicular to a growth surface) is superior to growth in an m-direction (a direction parallel to the growth surface) thermodynamically, and it is difficult to grow AlN in a direction to widen the wafer diameter.

As described above, since it has been difficult to widen the wafer diameter in a homo-growth of the AlN single crystal, a method of hetero-growing the AlN crystal on a SiC substrate using SiC having a relatively large wafer diameter and a relatively small lattice mismatch as compared with AlN as a substrate has been considered.

However, as illustrated in FIG. 1, there is a large difference in thermal expansion coefficient between an AlN growth layer 10 and a SiC substrate 20, and there is a problem that many cracks occur in the AlN growth layer 10 since AlN has a higher shrinkage rate than SiC in a cooling process of an AlN crystal growth process.

In response to this problem, the present inventors have proposed a method of alleviating stress on AlN at the time of cooling based on a difference in the thermal expansion coefficient between AlN and SiC by using a SiC brittle substrate 21 subjected to processing of reducing strength of the SiC substrate and improving expansion rate and shrinkage degree, such as through hole processing, on the SiC substrate (filed on the same day as this application, see FIG. 2).

By performing processing for improving expansion and shrinkage rate of the SiC substrate, the cracks during cooling are generated in the SiC brittle substrate 21, and occurrence of cracks can be suppressed in the AlN growth layer 10.

As described above, the present inventors have found a method for suppressing the occurrence of cracks in a hetero-growth of AlN, but have faced further problems in practical application of the method.

Since mechanical strength of the SiC brittle substrate 21 described above is significantly reduced, the conventional face-down method (a method in which a growth surface of the substrate faces downward, and an AlN growth source 40 is arranged at a position facing the growth surface) has a problem that only one end of the SiC brittle substrate 21 is supported, and thus a deflection occurs due to weight, and the substrate is damaged (FIG. 3).

For this problem, the present inventors have studied a change from the conventional face-down method to a face-up method (a method in which the growth surface of the substrate faces upward, and the AlN growth source 40 is arranged at a position facing the growth surface) (FIG. 4).

In the face-up method, since the entire SiC brittle substrate 21 can be supported, the deflection does not occur even when the strength of the SiC brittle substrate 21 is significantly low.

On the other hand, since the AlN growth source 40 is located above, the source adheres to the SiC substrate in a solid state (downfall), and this downfall can be a starting point of defects and a factor of polycrystallization of the AlN growth crystals (FIG. 4).

Therefore, an object of the present invention is to provide a modified AlN source for suppressing downfall.

Solution to Problem

The present invention that is intended to solve the problems above is a modified aluminum nitride source including an aluminum nitride sintered body having a bulk density of 2.0 g/cm$^3$ or more and an open porosity of 10% or less.

Such a modified aluminum nitride source suppresses the downfall and is suitable as a source material for the face-down method of crystal growth.

In a preferred mode of the present invention, carbon content is 1,000 ppm or less, and oxygen content is 10,000 ppm or less.

In a preferred mode of the present invention, the modified aluminum nitride source is used as a source material for the crystal growth of the aluminum nitride.

The present invention that is intended to solve the problems above is a method for manufacturing a modified aluminum nitride source, including a heat treatment step of heat treating an aluminum nitride source to produce an aluminum nitride sintered body.

By subjecting the aluminum nitride source to a heat treatment, it is possible to manufacture a modified aluminum nitride source in which the downfall is suppressed even when AlN crystal growth is performed in an arrangement of the face-up method.

In a preferred mode of the present invention, the method further includes an etching step of etching the aluminum nitride sintered body.

By etching the aluminum nitride sintered body, a source having a more excellent downfall suppression effect can be manufactured.

In a preferred mode of the present invention, the etching step is a step of performing chemical etching.

In a preferred mode of the present invention, the heat treatment step is a step of performing pressure sintering.

In a preferred mode of the present invention, the heat treatment step is a step of performing spark plasma sintering.

In a preferred mode of the present invention, the heat treatment step is a step of performing pressureless sintering, and includes a formation step of molding an aluminum nitride source to form an aluminum nitride formed body before the heat treatment step.

In a preferred mode of the present invention, the modified aluminum nitride source is a source material for the crystal growth of the aluminum nitride.

Further, the present invention that is intended to solve the problems above is:
a modified aluminum nitride source manufactured by the manufacturing method.

Further, the present invention that is intended to solve the problems above is a method for manufacturing an aluminum nitride crystal, including:
a crystal growth step of growing an aluminum nitride crystal on an underlying substrate by using a modified aluminum nitride source generated by subjecting an aluminum nitride source to the heat treatment as a source material for the crystal growth of the aluminum nitride.

According to the method for manufacturing an aluminum nitride crystal of the present invention, the downfall in the manufacturing process is suppressed, and an aluminum nitride crystal having few defects can be manufactured.

In a preferred mode of the present invention, the arrangement of the underlying substrate and the modified aluminum nitride source is by the face-up method.

In a preferred mode of the present invention, the modified aluminum nitride source is an aluminum nitride sintered body having a bulk density of 2.0 g/cm$^3$ or more and an open porosity of 0 to 10%.

Furthermore, the present invention that is intended to solve the problems above is an aluminum nitride crystal manufactured by the manufacturing method.

The aluminum nitride crystal of the present invention has low defects, and in particular, has low particle density derived from downfall.

Further, the present invention that is intended to solve the problems above in which:
in a method for suppressing a downfall of an aluminum nitride source in an aluminum nitride crystal growth step, a modified aluminum nitride source generated by heat treating of an aluminum nitride source is used as a source material for growing an aluminum nitride crystal on an underlying substrate.

In a preferred mode of the present invention, the arrangement of the underlying substrate and the modified aluminum nitride source is by the face-up method.

In a preferred mode of the present invention, the modified aluminum nitride source is an aluminum nitride sintered body having a bulk density of 2.0 g/cm$^3$ or more and an open porosity of 0 to 10%.

Advantageous Effects of Invention

According to the present invention, the downfall in aluminum nitride crystal growth can be suppressed, and an aluminum nitride single crystal with low defects can be manufactured.

DESCRIPTION OF EMBODIMENTS (1) AlN Source

Figure 1:
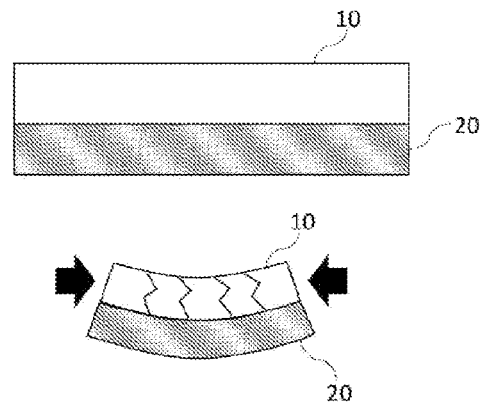
FIG. 1 is a view illustrating a crack occurrence mechanism in an AlN growth layer using SiC as an underlying substrate.
Figure 2:
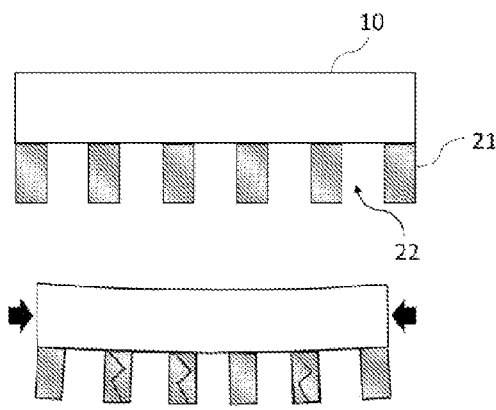
FIG. 2 is a view illustrating a crack occurrence suppression mechanism in an AlN growth layer using SiC having through holes as an underlying substrate.
Figure 3:
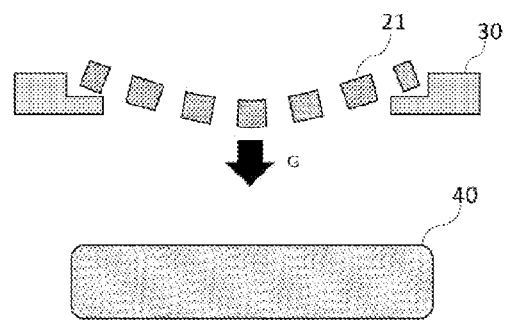
FIG. 3 is a view illustrating a state in which a SiC underlying substrate having through holes is arranged by a face-down method.
Figure 4:
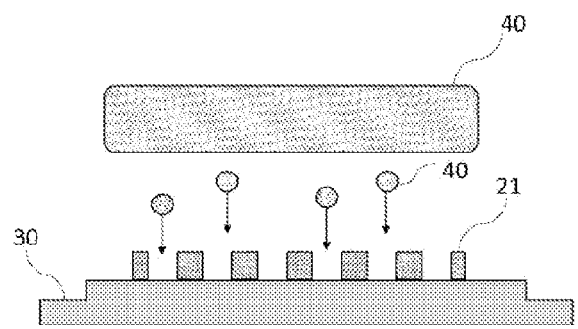
FIG. 4 is a view illustrating a state of an AlN powder source falling down by a face-up method.

The present invention is a method for manufacturing a modified AlN source by subjecting the aluminum nitride (AlN) source to the heat treatment.

In the present invention, an AlN source means a source from which an AlN sintered body is manufactured by heat treatment, and includes not only AlN powder, particles (powder particles), and formed bodies but also Al powder particles and Al formed body. The Al powder particles and the Al formed body are subjected to the heat treatment in a nitrogen atmosphere, so that a nitriding reaction proceeds and the AlN sintered body can be manufactured.

When powder particles are used as the AlN source, median diameter (d50) of the powder particles is preferably 50 μm or less, more preferably 30 μm or less, further preferably 10 µm or less, particularly preferably 5 µm or less, still more preferably 3 µm or less, and most preferably 1 µm or less.

By using the powder particles having a small median diameter as the AlN source, the modified AlN source that is more excellent in downfall suppressing action can be efficiently manufactured.

The AlN source preferably has an impurity amount of 10,000 ppm or less. The impurity amount of the AlN source is more preferably 8,000 ppm or less, still more preferably 6,000 ppm or less, and particularly preferably 5,000 ppm or less.

In addition, among the impurities contained in the AlN source, content of carbon atoms (C) is preferably 1,000 ppm or less, more preferably 800 ppm or less, still more preferably 600 ppm or less, particularly preferably 400 ppm or less, still more preferably 200 ppm or less, and most preferably 100 ppm or less.

Furthermore, among the impurities contained in the AlN source, content of oxygen atoms (O) is preferably 10,000 ppm or less, more preferably 8,000 ppm or less, still more preferably 6,000 ppm or less, and particularly preferably 5,000 ppm or less.

When the AlN source containing a large amount of impurities is used as a source for growing the AlN crystal, it is possible that defects caused by the impurities are introduced into the AlN crystal. Therefore, as the AlN source, it is preferable to use an AlN source having less impurities.

The AlN source is preferably manufactured by directly nitriding aluminum. The AlN source thus manufactured has a small content of impurities.

(2) Heat Treatment Step

The heat treatment method of the AlN source is not particularly limited, and includes a heat treatment performed under conditions where the AlN sintered body is generated as a result, in addition to the so-called pressureless sintering and pressure sintering.

Examples of the pressureless sintering include atmospheric sintering, thermal plasma sintering, microwave/millimeter wave sintering, and the like. When Al powder particles are used as the AlN source, reaction sintering can also be performed.

Examples of the pressure sintering include hot press sintering (HP), vacuum hot press sintering (VHP), and spark plasma sintering (pulse energization method, pulse energization pressure sintering method, SPS), and the like.

In the present invention, the AlN sintered body is preferably manufactured by the pressure sintering, and more preferably manufactured by the spark plasma sintering.

The spark plasma sintering is a method in which a pulse voltage and a current are directly applied to a sintering die made of graphite and a material to be sintered, and self-heating and pressurization are used as a driving force for sintering, and it is possible to rapidly raise temperature and cool the material as compared with atmospheric heating using an electric furnace or the like. Therefore, a dense sintered body in which grain growth is suppressed can be efficiently manufactured.

In the manufacturing of the AlN sintered body, a sintering aid may be added as necessary. As the sintering aid, calcium oxide (CaO), aluminum oxide ($Al_2O_3$), yttrium oxide ($Y_2O_3$), and the like can be used.

Sintering temperature for manufacturing the AlN sintered body varies depending on presence or absence of the sintering aid and types of the sintering aid, but the sintering can be performed at a temperature of 1400° C. or higher and less than 2400° C. Furthermore, the sintering temperature is more preferably 1600° C. or more, still more preferably 1700° C. or more, particularly preferably 1800° C. or more, and most preferably 1850° C. or more.

Moreover, the atmosphere temperature is more preferably 2100° C. or less, still more preferably 2000° C. or less, and particularly preferably 1950° C. or less.

Heat treatment time of the AlN source can be appropriately set by a sintering method.

When the pressure sintering is adopted as a heat treatment method, the heat treatment time can be set to about 1 minute to 2 hours, and can be set to about 5 minutes to 1 hour.

When the pressureless sintering is adopted as the heat treatment method, the heat treatment time can be set to 1 hour or more, 3 hours or more, 5 hours or more, 10 hours or more, 20 hours or more, 30 hours or more, 40 hours or more, 50 hours or more, 60 hours or more, 70 hours or more, or 80 hours or more.

The heat treatment may be performed under an inert gas atmosphere, for example, under a nitrogen gas atmosphere.

In this case, a flow rate of the inert gas is not particularly limited, but is preferably 0.5 to 20 slm, more preferably 1 to 10 slm, still more preferably 1 to 5 slm, and particularly preferably 2 to 4 slm.

It is preferable to use a jig having a carbon content of 1% by mass or less as a jig used in the heat treatment, specifically, a jig such as a container for storing the AlN source, a setter, a press die, or a press rod. The jig more preferably has a carbon content of 0.5% by mass or less, further preferably 0.1% by mass or less, particularly preferably 0.01% by mass or less, further preferably 0.001% by mass or less, and most preferably does not contain carbon.

When carbon is contained in the jig used for the heat treatment, the carbon is supplied from the jig to the AlN source by the heat treatment, and it is possible that the carbon content of the modified AlN source increases. By reducing the carbon as a material of the jig as much as possible, the carbon content in the modified AlN source, that is, the amount of impurities can be reduced.

Examples of the materials used for the jig include heat-resistant materials such as boron nitride, tungsten, tungsten carbide, tantalum, tantalum carbide, molybdenum, and molybdenum carbide.

The AlN sintered body obtained by the heat treatment step is preferably subjected to an annealing treatment to remove oxygen and/or the sintering aid when used.

Annealing treatment temperature is preferably 1800° C. or more, and more preferably 1900° C. or more.

Annealing treatment time is preferably 3 hours or more, more preferably 5 hours or more, still more preferably 7 hours or more, and particularly preferably 10 hours or more.

The annealing treatment is preferably performed in a non-oxidizing atmosphere. Examples of the non-oxidizing atmosphere include an inert gas atmosphere such as nitrogen, argon, or He, a vacuum atmosphere, and the like.

(3) Formation Step

When the pressureless sintering is adopted as the heat treatment method, a formation step of molding the AlN source to manufacture an AlN formed body may be included before the heat treatment step.

The method for molding the AlN formed body is not particularly limited, and a conventional ceramic formation method can be used.

Examples of the formation methods include a machine press method, an isostatic press method, extrusion molding, injection molding, slip casting, and the like.

(4) Etching Step

The AlN sintered body generated by the heat treatment step described above is preferably further etched. The etching provides a modified AlN source having a more excellent downfall suppression effect.

As a means for etching, chemical etching is preferably adopted.

Examples of the chemical etching include thermal etching under a reactive gas atmosphere, and wet etching.

Examples of the thermal etching under a reactive gas atmosphere include hydrogen etching, and etching using a halogenated gas.

As the wet etching, wet etching using KOH can be exemplified.

Etching the AlN sintered body provides a modified AlN source having a more excellent downfall suppression effect.

(5) Modified AlN Source

Furthermore, the present invention relates to a modified AlN source manufactured by the manufacturing method above.

The present inventors have found that the AlN sintered bodies obtained by the heat treatment described above can be roughly divided into three groups. Physical properties and attributes of the three groups are respectively summarized in Table 1.

TABLE 1

| Group number | Difference between packing density and apparent density | Absolute value of packing density and apparent density | Attributes |
| --- | --- | --- | --- |
| Group I | Almost no difference | Relatively lower than those in Group II | Low open porosity High closed porosity |
| Group II | Almost no difference | Relatively higher than those in Group I | Low open porosity Low closed porosity |
| Group III | Packing density is lower than apparent density | Lower packing density than those in Group I and Group II | High open porosity |

Figure 5:
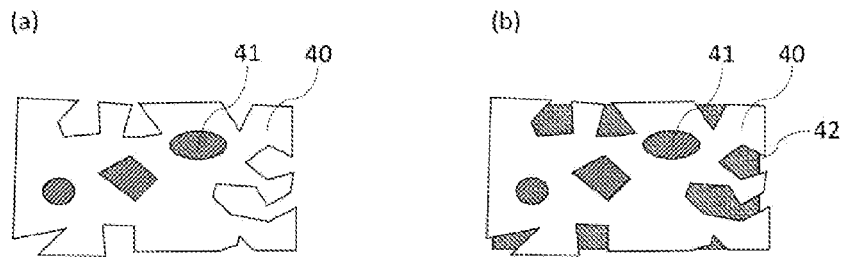
FIG. 5 is an explanatory view for explaining a difference between an apparent density and a bulk density.

Furthermore, FIG. 5 illustrates an explanatory view for explaining a difference in the apparent density and bulk density.

As illustrated in FIG. 5(a), the apparent density is a density obtained by adding the volume of closed pores 41 to the volume occupied by the AlN growth source 40 itself (the substance itself) as a volume for density calculation.

On the other hand, the bulk density is a density obtained by adding the volume of the open pores 42 in addition to the volume occupied by the AlN growth source 40 itself and the volume of the closed pores 41 as a volume for density calculation.

The AlN sintered bodies of Group I and Group II have almost no difference in the apparent density and the bulk density. In other words, since the difference between the apparent density and the bulk density can be said to be a difference in the open pores, the AlN sintered bodies of Group I and Group II can be said to have less or almost no open pores.

On the other hand, in Group I, absolute values of the apparent density and the bulk density are relatively lower than those in Group II. Therefore, it can be seen that Group I has a relatively larger volume than Group II, and as described above, since the AlN sintered bodies of Group I and Group II have an attribute of less open pores, it can be said that this difference in volume is a difference in the volume of the closed pores. In other words, it can be said that Group I has a relatively larger ratio of closed pores than Group II.

On the other hand, it can be said that Group II has a relatively small volume, that is, a relatively small ratio of closed pores as compared with Group I.

In Group III, there is a difference in the apparent density and the bulk density, and specifically, the bulk density is lower than the apparent density.

As described above, since the difference between the apparent density and the bulk density can be said to be a difference in the volume of the open pores, the AlN sintered body of Group III can be said to have a high volume of the open pores.

Hereinafter, the physical properties of the AlN sintered bodies belonging to each group will be further described in more detail. In addition, the AlN sintered bodies of Groups I to III are respectively referred to as modified AlN sources I to III.

(Modified AlN Source I)

The apparent density of the modified AlN source I is preferably less than 3.2 g/cm$^3$, more preferably less than 3.15 g/cm$^3$. In addition, the apparent density of the modified AlN source I is preferably 2.0 g/cm$^3$ or more, more preferably 2.5 g/cm$^3$ or more, still more preferably 2.7 g/cm$^3$ or more. For example, the apparent density of the modified AlN source of Group I may be 2.9 g/cm$^3$ or more, or 3.0 g/cm$^3$ or more.

The bulk density of the modified AlN source I is preferably less than 3.2 g/cm$^3$, more preferably less than 3.15 g/cm$^3$. Furthermore, the bulk density of the modified AlN source I is preferably 2.0 g/cm$^3$ or more, more preferably 2.5 g/cm$^3$ or more, still more preferably 2.7 g/cm$^3$ or more. Moreover, the bulk density of the modified AlN source of Group I may be 2.9 g/cm$^3$ or more, or may be 3.0 g/cm$^3$ or more.

The absolute value of the difference between the apparent density and the bulk density of the modified AlN source I is preferably 0 to 0.1, more preferably 0 to 0.05, and still more preferably 0 to 0.01.

The open porosity in the modified AlN source I is preferably 0 to 10%, more preferably 0 to 5%, further preferably 0 to 3%, particularly preferably 0 to 1%, still further preferably 0 to 0.5%, and most preferably 0 to 0.1%.

In addition, closed porosity in the modified AlN source I is preferably 0.8 to 25%, more preferably 1 to 20%, further more preferably 1 to 18%, particularly preferably 2 to 16%, and most preferably 4 to 14%.

It can be estimated that the modified AlN source I is manufactured without applying too strong pressure to the AlN powder particles, or by using the AlN powder particles having a large particle diameter in such a way not to bring an inter-particle distance close and by applying a large amount of thermal energy. Specific pressure and energy vary depending on the particle diameter of the AlN powder particles and the manufacturing method to be adopted, but examples of a means for manufacturing the modified AlN source I include a spark plasma sintering method using AlN powder particles with a large particle diameter and a method of sintering by a hot press method using AlN powder particles with a large particle diameter.

In addition, a method in which the AlN powder particles are press-molded and then subjected to the annealing treatment is included.

Furthermore, the modified AlN source I has an attribute of high closed porosity, but as a growth reaction of the AlN crystals to be described later proceeds, a portion that was a closed pore is exposed to become an open pore, and there is a possibility that the modified AlN source I has an attribute similar to that of the modified AlN source III.

(Modified AlN Source II)

The apparent density of the modified AlN source II is preferably 3.2 g/cm$^3$ or more. In addition, the apparent density of the modified AlN source I is preferably 3.26 g/cm$^3$ or less.

The bulk density of the modified AlN source II is 3.2 g/cm$^3$ or more. In addition, the bulk density of the modified AlN source is preferably 3.26 g/cm$^3$ or less.

The absolute value of the difference between the apparent density and the bulk density of the modified AlN source II is preferably 0 to 0.1, more preferably 0 to 0.05, and still more preferably 0 to 0.01.

The open porosity in the modified AlN source II is preferably 0 to 10%, more preferably 0 to 5%, further preferably 0 to 3%, particularly preferably 0 to 1%, still more preferably 0 to 0.5%, and most preferably 0 to 0.1%.

Furthermore, the closed porosity in the modified AlN source II is preferably 0 to 4%, more preferably 0 to 3%, still more preferably 0 to 2%, particularly preferably 0 to 1%, further preferably 0 to 0.8%, and most preferably 0 to 0.7%.

It is presumed that the modified AlN source II can be manufactured by applying a strong pressure or reducing the inter-particle distance using the AlN powder particles having a small particle diameter and by applying a large amount of thermal energy.

Specific pressure and energy vary depending on the particle diameter of the AlN powder particles and the adopted manufacturing method, but examples of a means for manufacturing the modified AlN source II include a method for manufacturing the AlN sintered bodies by sintering via the spark plasma sintering method, a vacuum hot press method, and the hot press method.

(Modified AlN Source III)

The apparent density of the modified AlN source III is preferably 3.26 g/cm$^3$ or less, more preferably 3.2 g/cm$^3$ or less, and still more preferably 3.1 g/cm$^3$ or less. Furthermore, the apparent density of the modified AlN source III is preferably 2.2 g/cm$^3$ or more, more preferably 2.5 g/cm$^3$ or more, further preferably 2.7 g/cm$^3$ or more, and particularly preferably 2.9 g/cm$^3$ or more.

The bulk density of the modified AlN source III is preferably 2.5 g/cm$^3$ or less, more preferably 2.3 g/cm$^3$ or less, and still more preferably 2.2 g/cm$^3$ or less. Furthermore, the bulk density of the modified AlN source III is preferably 1 g/cm$^3$ or more, more preferably 1.2 g/cm$^3$ or more, and still more preferably 1.5 g/cm$^3$ or more.

Moreover, as another mode, the bulk density of the modified AlN source III is preferably 1.6 g/cm$^3$ or more, more preferably 1.8 g/cm$^3$ or more, and still more preferably 2.0 g/cm$^3$ or more.

In addition, the modified AlN source III has a bulk density lower than the apparent density.

The difference between the apparent density and the bulk density of the modified AlN source III is preferably 0.5 to 2.5 g/cm$^3$, more preferably 0.7 to 2 g/cm$^3$, and still more preferably 1 to 1.5 g/cm$^3$.

The open porosity in the modified AlN source III is preferably 10 to 60%, more preferably 20 to 60%, further preferably 25 to 60%, particularly preferably 25 to 55%, and most preferably 25 to 50%.

Furthermore, the closed porosity in the modified AlN source III is preferably 2 to 10%, more preferably 2 to 8%, still more preferably 4 to 8%, and particularly preferably 4 to 6%.

As the modified AlN source having a low downfall occurrence rate, the modified AlN source I and the modified AlN source II are preferable, and the modified AlN source II is more preferable.

Therefore, it is preferable to use modified AlN sources (the modified AlN source I-II) classified as either the modified AlN source I or the modified AlN source II as the modified AlN source, and the following can be exemplified as such a modified AlN source.

The apparent density of the modified AlN sources I-II is preferably 2.5 g/cm$^3$ or more, more preferably 2.6 g/cm$^3$ or more, still more preferably 2.7 g/cm$^3$ or more, and particularly preferably 2.8 g/cm$^3$ or more. In addition, the apparent density of the modified AlN sources I-II is preferably 3.26 g/cm$^3$ or less.

The bulk density of the modified AlN sources I-II is preferably 2.5 g/cm$^3$ or more, more preferably 2.6 g/cm$^3$ or more, still more preferably 2.7 g/cm$^3$ or more, and particularly preferably 2.8 g/cm$^3$ or more. In addition, the bulk density of the modified AlN sources I-II is preferably 3.26 g/cm$^3$ or less.

The absolute value of the difference between the apparent density and the bulk density of the modified AlN sources I-II is preferably 0 to 0.8, more preferably 0 to 0.6, still more preferably 0 to 0.4, particularly preferably 0 to 0.2, still further preferably 0 to 0.1, and most preferably 0 to 0.01.

The open porosity in the modified AlN sources I-II is preferably 0 to 10%, more preferably 0 to 5%, further preferably 0 to 3%, particularly preferably 0 to 1%, still more preferably 0 to 0.5%, and most preferably 0 to 0.1%.

Furthermore, the closed porosity in the modified AlN sources I-II is preferably 0 to 25%, more preferably 0 to 20%, further preferably 0 to 18%, particularly preferably 0 to 16%, and most preferably 0 to 14%.

The apparent density and the bulk density described above can be obtained by Archimedes method using distilled water.

Moreover, the open porosity and the closed porosity can be obtained based on the following formulas.

[Math. 1]

$$\text{Apparent density} = \frac{W_1}{W_1 - W_2} \times \rho_1 \quad (1)$$

$w_1$: Dried weight of sample $w_2$: Weight of a sample impregnated in liquid that is weighted in a suspended state (weight in water)

$\rho_1$: Density of liquid

[Math. 2]

$$\text{Bulk density} = \frac{W_1}{W_3 - W_2} \times \rho_1 \quad (2)$$

$w_3$: Weight after wiping the liquid on surface (water-saturated weight in air)

[Math. 3]
$$\text{Open porosity} = \frac{W_3 - W_1}{W_3 - W_2} \times 100 \qquad (3)$$

[Math. 4]
$$\text{Relative density} = \frac{\text{Packing density}}{\text{Theoretical density}} \times 100 \qquad (4)$$

[Math. 5]
$$\text{Relative density} + \text{All porosity} = 100 \qquad (5)$$

[Math. 6]
$$\text{All porosity} = \text{Open porosity} + \text{Closed porosity} \qquad (6)$$

[Math. 7]
$$\text{Closed porosity} = 100 - (\text{Relative density} + \text{Open porosity}) \qquad (7)$$

Furthermore, theoretical density of AlN is 3.26 g/cm$^3$.

The modified AlN source of the present invention is preferably used as a source material (a supply source) for crystal growth of AlN. In addition, the modified AlN source is preferably used as a source material in crystal growth by a so-called face-up method in which the growth surface of the crystal growth substrate faces upward and the crystal growth source material is arranged at a position facing the growth surface.

Even when the modified AlN source of the present invention is used as the source material for the face-up method, the downfall hardly occurs, and the AlN single crystal with low defects can be manufactured.

In addition, as a preferable range of impurity amount in the modified AlN source of the present invention, the preferable range of the impurity amount in the AlN source described above can be applied as it is.

(6) Method for Suppressing Downfall of AlN Source

Moreover, the present invention also relates to a method for suppressing downfall of the AlN source in the AlN crystal growth step.

In a downfall suppression method of the present invention, the modified AlN source described above is used as the source material (the supply source).

The downfall suppression method of the present invention is particularly effective in the AlN crystal growth by the face-up method described above.

The AlN crystal growth method to which the method of the present invention is applied is preferably a vapor phase growth method.

A growth temperature in the AlN crystal growth method can be set to a temperature known as an AlN crystal growth temperature, and can be set to, for example, about 1600 to 2200° C.

In addition, the method of the present invention is preferably applied when heteroepitaxial growth of AlN crystals is performed. A heterogeneous substrate used for the heteroepitaxial growth is not particularly limited, but a generally used one for manufacturing a semiconductor substrate can be adopted. Examples include sapphire substrates, IV group semiconductor substrates such as Si, germanium (Ge), and diamond (C), II-VI group semiconductor substrates such as zinc selenide (ZnSe), cadmium sulfide (CdS), and zinc oxide (ZnO), III-V group semiconductor substrates such as GaAs, GaN, and AlN, IV group compound semiconductor substrates such as SiC and silicon germanium (SiGe), gallium oxide (Ga$_2$O$_3$) substrates, and the like.

From the viewpoint of lattice mismatch and thermal expansion coefficient, it is preferable to use a SiC substrate.

As the SiC substrate, a SiC brittle substrate subjected to an embrittlement processing is preferably used.

Moreover, in the present description, the embrittlement processing is a processing for reducing the strength of the underlying substrate. In other words, it is a step of processing the underlying substrate such that the underlying substrate is easily deformed or broken by an external force. Moreover, the term "strength" in the present description refers to durability against a physical external force such as compression or tension, and includes a concept of mechanical strength.

Examples of the embrittlement processing include a method of forming through holes in the underlying substrate. By forming the through holes in the underlying substrate, the underlying substrate is easily deformed or broken by the external force.

(7) Method for Manufacturing AlN Crystal

The present invention also relates to a method for manufacturing the AlN crystal using the modified AlN source.

In other words, in the manufacturing method of the present invention, the AlN crystal with few defects can be manufactured by using the modified AlN source as the source material for growing the AlN crystal.

The AlN crystal is preferably an AlN semiconductor substrate.

Furthermore, the AlN crystal is preferably a single crystal.

The method for manufacturing the AlN crystal of the present invention is preferably a method for manufacturing an AlN crystal by epitaxial growth using an underlying substrate. In particular, it is preferable to produce the AlN crystal by the heteroepitaxial growth.

In the manufacturing method of the present invention, the underlying substrate described above can be used, and the SiC substrate is preferably used. In particular, it is preferable to use the SiC brittle substrate subjected to the embrittlement processing.

In addition, the method for manufacturing the AlN crystal of the present invention is preferably a method for manufacturing the AlN crystal by the so-called face-up method in which a crystal growth surface of the underlying substrate is upward (in a direction opposite to a direction of gravity), and the source material is arranged in a direction facing the crystal growth surface of the underlying substrate.

Figure 6:
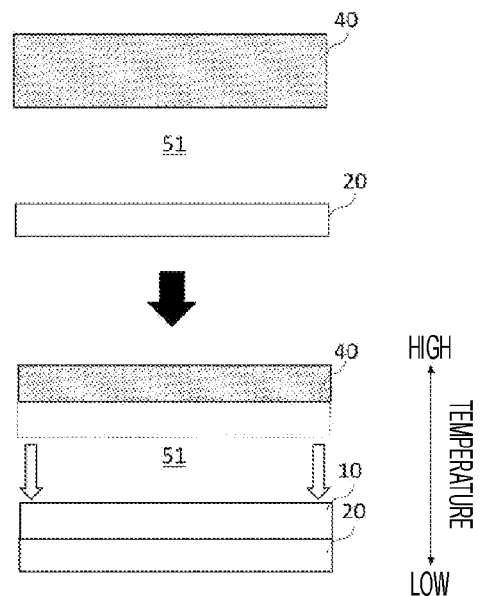
FIG. 6 is an explanatory view for explaining a crystal growth step in the method for manufacturing AlN crystals using a modified AlN source.

FIG. 6 illustrates an explanatory view for explaining the AlN crystal growth step.

The AlN crystal growth step is a step of arranging in a facing (confronting) manner and heating the SiC substrate 20 and the AlN growth source 40. The AlN growth source 40 is the modified AlN source described above.

By heating the SiC substrate 20 and the AlN growth source 40 arranged in this manner, the source is transported from the AlN growth source 40 onto the SiC substrate 20 via a source transport space 51.

As the driving force for transporting the source, a temperature gradient or a chemical potential difference between the SiC substrate 20 and the AlN growth source 40 can be adopted.

Specifically, a vapor composed of an element sublimated from the AlN growth source 40 is transported by diffusing in the source transport space 51, and is supersaturated and condense on the SiC substrate 20 set to have a temperature lower than that of the AlN growth source 40. Alternatively, the AlN is supersaturated and condensed on the SiC substrate 20 having a chemical potential lower than that of the AlN growth source 40. As a result, the AlN growth layer 10 is formed on the SiC substrate 20.

Furthermore, in this crystal growth step, the doping concentration of the AlN growth layer 10 may be adjusted using a doping gas. Moreover, the doping concentration of the AlN growth layer 10 may be adjusted by adopting the AlN growth source 40 having a doping concentration different from that of the SiC substrate 20.

Although a mode in which the AlN growth layer 10 is formed by a PVT method has been shown using FIG. 6, the method for manufacturing the AlN crystal of the present invention can be naturally adopted as long as it is a method capable of forming the AlN growth layer 10.

As the substrate, the SiC brittle substrate described above is preferably used.

By using the SiC brittle substrate, the occurrence of cracks in the AlN crystals can be suppressed when the temperature is lowered after the crystal growth.

Furthermore, according to the present invention, since the modified AlN source described above is used as the AlN growth source, even when an arrangement relationship between the underlying substrate and the modified AlN source is face-up, the modified AlN source can suppress the downfall on the growth surface of the underlying substrate. As a result, the AlN crystals with extremely few defects can be manufactured.

EXAMPLES (Test Example 1) Manufacturing Modified AlN Source

Two types of AlN powder particles (fine powder; median diameter (d50)=1 μm, coarse powder: median diameter (d50)=10 μm) were prepared, and ten types of modified AlN sources were manufactured by the processing methods described in Table 2. The details of each processing method are summarized in Table 3.

The apparent density and the bulk density of each modified AlN source were measured by the Archimedes method (liquid used: distilled water). In addition, the open porosity and the closed porosity were calculated for each modified AlN source. The results are shown in Table 4 and FIG. 7.

TABLE 2

| Source number | Processing methods | AlN powder |
|---|---|---|
| Source 1 | Vacuum hot press | Fine powder |
| Source 2 | Spark plasma sintering | Fine powder |
| Source 3 | Hot press + addition of organic binders | Fine powder |
| Source 4 | Spark plasma sintering | Coarse powder |
| Source 5 | Hot press | Fine powder |
| Source 6 | Hot press | Coarse powder |
| Source 7 | Mechanical press molding + annealing treatment | Fine powder |
| Source 8 | Mechanical press molding + annealing treatment | Fine powder |
| Source 9 | Annealing treatment | Fine powder |
| Source 10 | Annealing treatment | Coarse powder |

TABLE 3

| Source | Processing methods | Devices to be used | Weight (g) | Pressure (MPa) | Temperature (° C.) | Duration | Atmosphere |
|---|---|---|---|---|---|---|---|
| Source 1 | Vacuum hot press | Vacuum hot press device | 30 | 50 | 1900 | 20 Minutes | — |
| Source 2 | Spark plasma sintering | Spark plasma sintering device | 5 | 25 | 1700 | 5 Minutes | — |
| Source 3 | Hot press + organic binders | Hot press device | 4 | 40 | 1900 | 60 Minutes | $N_2$ atmosphere |
| Source 4 | Spark plasma sintering | Spark plasma sintering device | 1 | 50 | 2000 | 5 Minutes | — |
| Source 5 | Hot press | Hot press device | 15 | 40 | 1900 | 60 Minutes | $N_2$ atmosphere |
| Source 6 | Hot press | Hot press device | 15 | 40 | 1850 | 60 Minutes | $N_2$ atmosphere |
| Source 7 | Press molding + annealing | Press molding: one-axis press device Annealing: atmospheric heating using an electric furnace | 5 | 50 | 1850 | 24 Hours | $N_2$ atmosphere |
| Source 8 | Press molding + annealing | Press molding: one-axis press device Annealing: atmospheric heating using an electric furnace | 5 | 40 | 1940 | 24 Hours | $N_2$ atmosphere |

TABLE 3-continued

| Source | Processing methods | Devices to be used | Weight (g) | Pressure (MPa) | Temperature (° C.) | Duration | Atmosphere |
|---|---|---|---|---|---|---|---|
| Source 9 | Annealing | Atmospheric heating using an electric furnace | 5 | — | 1940 | 3 Hours | $N_2$ atmosphere |
| Source 10 | Annealing | Atmospheric heating using an electric furnace | 5 | — | 1940 | 3 Hours | $N_2$ atmosphere |

TABLE 4

| Physical properties | Source 1 | Source 2 | Source 3 | Source 4 | Source 5 | Source 6 | Source 7 | Source 8 | Source 9 | Source 10 |
|---|---|---|---|---|---|---|---|---|---|---|
| Apparent density (g/cm³) | 3.26 | 3.25 | 3.04 | 2.82 | 3.24 | 3.10 | 3.24 | 3.11 | 2.99 | 2.94 |
| Packing density (g/cm³) | 3.26 | 3.25 | 2.14 | 2.82 | 3.24 | 3.10 | 3.24 | 3.11 | 1.61 | 1.58 |
| Open porosity (%) | 0.01 | 0.00 | 29.74 | 0.00 | 0.00 | 0.00 | 0.08 | 0.04 | 46.00 | 46.06 |
| Closed porosity (%) | 0.10 | 0.38 | 4.74 | 13.52 | 0.47 | 4.80 | 0.69 | 4.45 | 4.46 | 5.36 |
| AlN powder particles median diameter (μm) | 1 | 1 | 1 | 10 | 1 | 10 | 1 | 1 | 1 | 10 |
| Groups | Group II | Group II | Group III | Group I | Group II | Group I | Group II | Group I | Group III | Group III |

Figure 7:
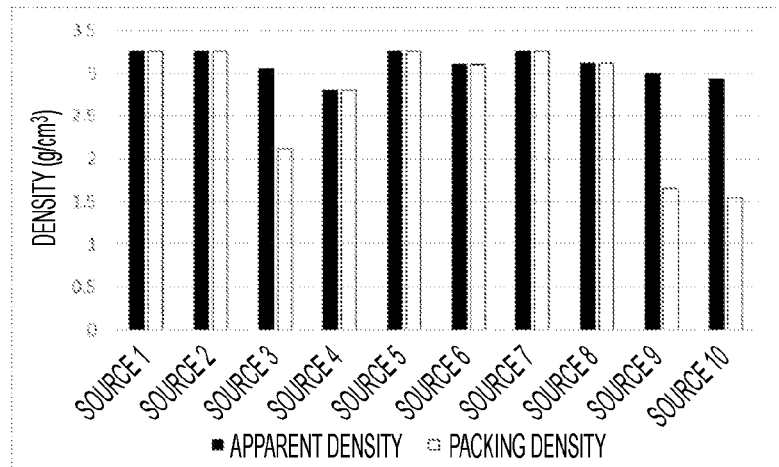
FIG. 7 is a view illustrating an apparent density and a bulk density of each modified AlN source.

As shown in Table 4 and FIG. 7, a source 1, a source 2, a source 4, a source 5, a source 6, a source 7, and a source 8 have the same apparent density and bulk density. Among them, the source 1, the source 2, the source 5, and the source 7 each have a density of 3.20 g/cm³ or more, which is relatively high when compared with the density of the source 4, the source 6, and the source 8, and the former four sources belong to Group II described above. On the other hand, the source 4, the source 6, and the source 8 belong to Group I described above.

In addition, a source 3, a source 9, and a source 10 have a bulk density lower than the apparent density, and belong to Group III described above.

(Test Example 2) Downfall Suppression Effect Verification Test

Figure 8:
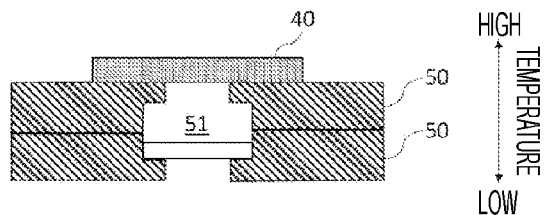
FIG. 8 is a view illustrating a device configuration in an AlN crystal growth step.

FIG. 8 illustrates a configuration of the device in the downfall suppression effect verification test.

As illustrated in FIG. 8, the SiC substrate 20 (4H—SiC, substrate size: 10 mm) having a substrate size of 10 mm was arranged with the growth surface facing upward using a jig 50 (material: tantalum carbide and tungsten).

Next, the AlN growth source 40 (modified AlN source 2 in Tables 1 to 4) was arranged at a position facing the growth surface of the SiC substrate 20.

Moreover, the modified AlN source 2 was wet etched in advance under the following conditions.
(Etching Conditions)
  Etching temperature: 500° C.
  Etching time: 10 seconds
  Etching solution: KOH:NaOH=1:1
  Inside the assembled jig 50, the source transport space 51 exists between the SiC substrate 20 and the AlN growth source 40, and the growth source is transported from the AlN growth source 40 onto the SiC substrate 20 via the source transport space 51.

In the above arrangement, the SiC substrate and the AlN growth source 40 were arranged in a heating furnace, and the heat treatment was performed under the following conditions (Example 1).
(Heating Conditions)
  Heating temperature: 1900° C.
  Heating time: 8 hours
  $N_2$ gas pressure: 30 kPa Furthermore, the AlN crystals were grown on the SiC substrate 20 under the same conditions as in Example 1 except that, a source obtained by further heat treating the modified AlN source 2 for 18 hours (1900° C., 50 kPa, $N_2$ (3 slm), hereinafter the same), a source obtained by heat treating the AlN powder particles (fine particles) for 23 hours, and a source obtained by heat treating the AlN powder particles (fine particles) for 80 hours were arranged as the AlN growth source 40 (Examples 2 to 4).

Figure 9:
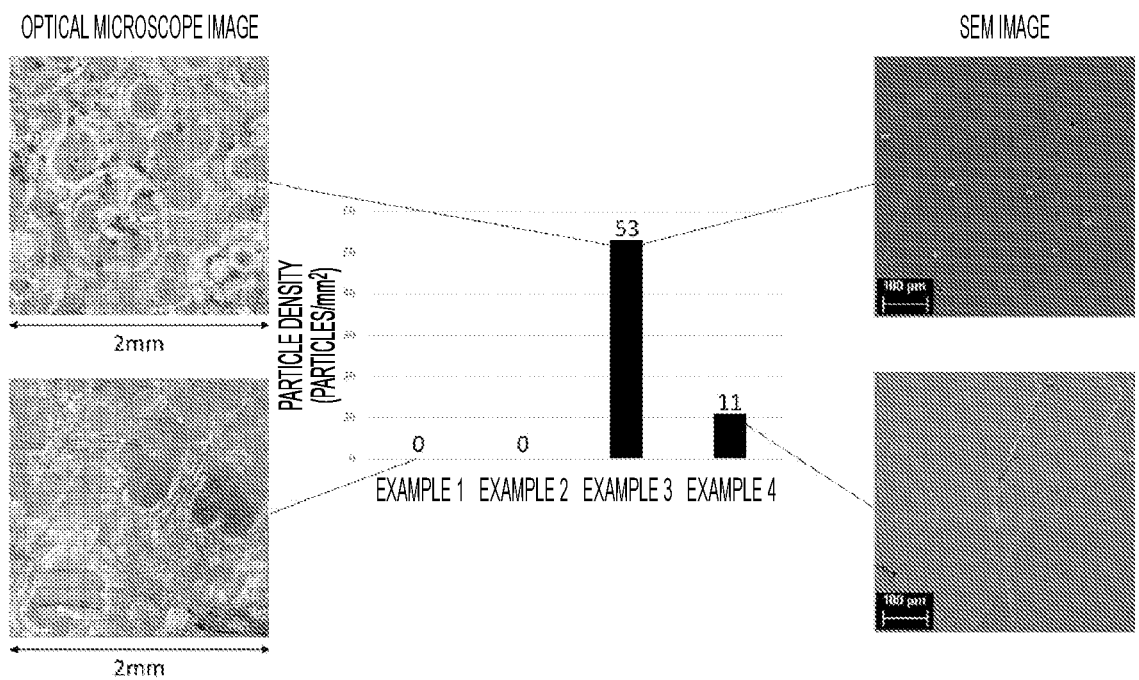
FIG. 9 is a graph showing particle density with respect to annealing treatment time on a growth surface of the AlN crystal, and an SEM image and an optical microscope image of the AlN crystal growth surface.

The growth surface of the AlN crystals of Example 1 and the growth surface of the AlN crystals of Example 3 were observed with an optical microscope, and the growth surface of the AlN crystals of Example 3 and the growth surface of the AlN crystals of Example 4 were observed with a scanning electron microscope (FIG. 9). Then, the number of particles in the entire surface of growth region of each AlN crystal was counted to calculate the particle density (particles/mm²).

The results are shown in Table 5 and FIG. 9.

TABLE 5

| Sample | Source material | Groups | Heat treatment time | Particle density (particles/mm²) |
|---|---|---|---|---|
| Example 1 | Modified AlN source 2 | Group II | | 0 |
| Example 2 | Modified AlN source 2 | Group II | 18 Hours | 0 |

TABLE 5-continued

| Sample | Source material | Groups | Heat treatment time | Particle density (particles/mm²) |
|---|---|---|---|---|
| Example 3 | Source for heat treatment of AlN fine particles | Group III | 23 Hours | 53 |
| Example 4 | Source for heat treatment of AlN fine particles | Group III | 80 Hours | 11 |

As shown in Table 5 and FIG. 9, it was confirmed that the AlN crystals of Examples 1 and 2 do not have particles (small pieces) at all.

It was found that the particle density of the AlN crystals (FIG. 9) subjected to the crystal growth using the modified AlN source that had been subjected to the heat treatment in Example 3 for 23 hours was 53 particles/mm², whereas in the case of using the modified AlN source of Example 4 subjected to the heat treatment for 80 hours and longer than that of Example 3, the particle density of the AlN crystals was reduced to 11 particles/mm², that is, reduced to about ⅕.

From this result, it was found that by using the modified AlN source manufactured by the manufacturing method of the present invention as the source material, the downfall of the source material is suppressed, and the AlN crystals with low defects can be manufactured.

(Test Example 3) Downfall suppression effect verification test 2

The AlN crystals were grown by the same method as the method of Test Example 2 using the sources 1, 3 to 5, and 8 to 10 among the sources 1 to 10 shown in Table 3. Then, the number of particles in the entire surface of growth region of each AlN crystal was counted to calculate the particle density (particles/mm²). In addition, the sources 1, 3 to 5, and 8 were etched in advance by the same method as the method shown in Test Example 2.

The results are shown in Table 6.

On the other hand, in the AlN crystals using the sources 3, 9, and 10, it was confirmed that needle-like crystals were formed on a crystal surface. It is considered that this needle-like crystal was generated by many particles falling on an AlN crystal surface.

From these results, it was found that the modified aluminum nitride source composed of an aluminum nitride sintered body having a bulk density of 2.0 g/cm³ or more and an open porosity of 0 to 10% is excellent in the downfall suppression effect and is suitable as a source material for crystal growth using the face-up method.

INDUSTRIAL APPLICABILITY

The present invention can be applied to an AlN crystal growth technique.

REFERENCE SIGNS LIST

10 AlN growth layer
20 SiC substrate
21 SiC brittle substrate
22 Through hole
30 Holder
40 AlN growth source
50 Jig
51 Source transport space
G Gravity

The invention claimed is:

1. A modified aluminum nitride source comprising an aluminum nitride sintered body having a bulk density of 2.8 g/cm³ or more, an open porosity of 0 to 0.1%, a closed porosity of 0 to 14%, a carbon content of 200 ppm or less, and an oxygen content of 5,000 ppm or less.

2. The modified aluminum nitride source according to claim 1, wherein the modified aluminum nitride source is used as a source material for crystal growth of an aluminum nitride.

3. A method for manufacturing a source material for crystal growth of an aluminum nitride, the method comprising a heat treatment step of subjecting an aluminum nitride

TABLE 6

| Physical properties | Source 1 | Source 3 | Source 4 | Source 5 | Source 8 | Source 9 | Source 10 |
|---|---|---|---|---|---|---|---|
| Apparent density (g/cm³) | 3.26 | 3.04 | 2.82 | 3.24 | 3.11 | 2.99 | 2.94 |
| Packing density (g/cm³) | 3.26 | 2.14 | 2.82 | 3.24 | 3.11 | 1.61 | 1.58 |
| Open porosity (%) | 0.01 | 29.74 | 0.00 | 0.00 | 0.04 | 46.00 | 46.06 |
| Closed porosity (%) | 0.10 | 4.74 | 13.52 | 0.47 | 4.45 | 4.46 | 5.36 |
| AlN powder particles median diameter (μm) | 1 | 1 | 10 | 1 | 1 | 1 | 10 |
| Etching treatment | Yes | Yes | Yes | Yes | Yes | No | No |
| Groups | Group II | Group III | Group I | Group II | Group I | Group III | Group III |
| Particle density (particles/mm²) | 1 | Needle-like growth | 20 | 46 | 33 | Needle-like growth | Needle-like growth |

As shown in Table 6, it was confirmed that the AlN crystals using the sources 1, 4, 5, and 8 as the growth sources had few particles (small pieces).

source to a heat treatment to form an aluminum nitride sintered body, wherein the heat treatment step is a step of performing pressureless sintering, and includes a formation step of molding the aluminum nitride source to form an aluminum nitride formed body before the heat treatment step.

4. A method for manufacturing an aluminum nitride crystal, the method comprising a crystal growth step of growing an aluminum nitride crystal on an underlying substrate by using a modified aluminum nitride source manufactured by subjecting an aluminum nitride source to a heat treatment as a source material for crystal growth of aluminum nitride,
- wherein the modified aluminum nitride source has a bulk density of 2.8 g/cm$^3$ or more, an open porosity of 0 to 0.1%, a closed porosity of 0 to 14%, a carbon content of 200 ppm or less, and an oxygen content of 5,000 ppm or less, and
- wherein in the crystal growth step, a growth surface of the underlying substrate faces upwards, and the source material is arranged at a position facing the growth surface.

* * * * *